(12) United States Patent
Berkovitz et al.

(10) Patent No.: US 9,792,399 B2
(45) Date of Patent: Oct. 17, 2017

(54) INTEGRATED CIRCUIT HIERARCHICAL DESIGN TOOL APPARATUS AND METHOD OF HIERARCHICALLY DESIGNING AN INTEGRATED CIRCUIT

(71) Applicants: Asher Berkovitz, Kiryat Ono (IL); Inbar Ben-Porat, Petach-Tiqva (IL); Yossy Neeman, Gedera (IL)

(72) Inventors: Asher Berkovitz, Kiryat Ono (IL); Inbar Ben-Porat, Petach-Tiqva (IL); Yossy Neeman, Gedera (IL)

(73) Assignee: NXP USA, Inc., Austin, TX (US)

( * ) Notice: Subject to any disclaimer, the term of this patent is extended or adjusted under 35 U.S.C. 154(b) by 15 days.

(21) Appl. No.: 14/758,967

(22) PCT Filed: Jan. 7, 2013

(86) PCT No.: PCT/IB2013/050121
§ 371 (c)(1),
(2) Date: Jul. 2, 2015

(87) PCT Pub. No.: WO2014/106779
PCT Pub. Date: Jul. 10, 2014

(65) Prior Publication Data
US 2015/0339427 A1    Nov. 26, 2015

(51) Int. Cl.
*G06F 17/50*      (2006.01)

(52) U.S. Cl.
CPC ...... *G06F 17/5072* (2013.01); *G06F 17/5077* (2013.01); *G06F 17/5081* (2013.01)

(58) Field of Classification Search
CPC . H01L 2924/14; H01L 24/19; G06F 17/5077; G06F 12/0811; G06F 17/5068; G06F 17/5072; G06F 17/5081

(Continued)

(56) References Cited

U.S. PATENT DOCUMENTS 5,430,397 A * 7/1995 Itoh .................... G06F 1/10
326/101
6,298,468 B1   10/2001 Zhen
(Continued)

FOREIGN PATENT DOCUMENTS

WO    WO2014041402     3/2014

OTHER PUBLICATIONS

Shashank Prasad, Anuj Kumar, Simultaneous Routing and Feedthrough Algorithm to Decongest Top Channel, VLSI Design 2009: Improving Productivity through Higher Abstraction, The 22nd International Conference on VLSI Design, New Delhi, India, Jan. 5-9, 2009. pp. 399-403, IEEE, 2009.

(Continued)

*Primary Examiner* — Nghia Doan

(57) ABSTRACT

An integrated circuit hierarchical design tool apparatus comprises a processor arranged to support a block coupling reconfiguration unit. The block coupling reconfiguration unit is capable of receiving block layout data comprising block placement, terminal location data and intra-block connectivity data. The block coupling reconfiguration unit is arranged to identify from the block layout data a block placement level block having a terminal respectively coupled to a plurality of other block placement level blocks by a plurality of nets, and to provide the block with an additional terminal capable of providing the same function as the terminal. The block coupling reconfiguration unit is also arranged to replace a net of the plurality of nets that is coupled to the terminal with a replacement net coupled to the additional terminal.

15 Claims, 3 Drawing Sheets

(58) Field of Classification Search
USPC .................................. 716/111, 126, 129–130
See application file for complete search history.

(56) References Cited

U.S. PATENT DOCUMENTS

| | | |
|---|---|---|
| 6,374,394 B1 | 4/2002 | Camporese et al. |
| 6,412,097 B1 | 6/2002 | Kikuchi et al. |
| 6,496,968 B1 * | 12/2002 | Yamada .............. G06F 17/5077 |
| | | 716/129 |
| 6,567,967 B2 | 5/2003 | Greidinger et al. |
| 7,089,519 B1 | 8/2006 | Teig |
| 7,275,230 B2 | 9/2007 | Gentry et al. |
| 2002/0066066 A1 | 5/2002 | Tetelbaum et al. |
| 2008/0216026 A1 | 9/2008 | Gotou |
| 2009/0132986 A1 | 5/2009 | Kumano |

OTHER PUBLICATIONS

Jason Gentry, Encounter Digital Implementation System Floorplan Route Planning Using Bus Guides, Cadence User Conference Mar. 14, 2012.

Jurjen Westra, Patrick Groeneveld, Post-Placement Pin Optimization, VLSI, 2005. Proceedings. IEEE Computer Society Annual Symposium on VLSI, New Frontiers in VLSI Design, pp. 238-243.

International Search Report and Written Opinion correlating to PCT/IB2013/050121 dated Aug. 21, 20123.

\* cited by examiner

INTEGRATED CIRCUIT HIERARCHICAL DESIGN TOOL APPARATUS AND METHOD OF HIERARCHICALLY DESIGNING AN INTEGRATED CIRCUIT

FIELD OF THE INVENTION

This invention relates to an integrated circuit hierarchical design tool apparatus and a method of hierarchically designing an integrated circuit.

BACKGROUND OF THE INVENTION

In the field of Very Large Scale Integration (VLSI) design employed by the semiconductor industry, due to the size and complexity of the designs of processing devices as well as the increasing scale of integration, design methodologies have been developed in order to simplify the process of designing the processing devices. In this respect, one known methodology has a flow that is hierarchical in nature, comprising two or more levels of design abstraction, for example: a top level and a block level.

The top level comprises defining block placements and so-called pin locations, and the block level comprises designing and placing the block instances, the placements and pinning of which were defined at the top level. The pin locations are defined in order to make connections between blocks for the communication of electrical signals therebetween.

So-called "top nets" are the connections or tracks between blocks defined at the top level. However, in order to minimise congestion, available routes or route resources are limited and require certain nets to be minimised. Also, where the fan out of such top nets is greater than one, it can be difficult to identify optimal routes for the top nets that fan out. When the routing of the top net is suboptimal, for example due to suboptimal placement of one or more pins, one or more of the top nets lead to a relatively long detour path that can result in suboptimal performance in respect of electrical signals communicated using the undesirably long detour path.

U.S. Pat. No. 6,298,468 relates to a placement-based optimisation method and apparatus for computer-aided circuit design that describes the modification of a pin placement based upon congestion and the "Centre of Gravity" (COG) of logic blocks used.

U.S. Pat. No. 6,567,967 relates to a method of designing large standard-cell based integrated circuits and describes block placement, pin placement modification and feedthrough creation to reduce top level congestion.

SUMMARY OF THE INVENTION

The present invention provides an integrated circuit hierarchical design tool apparatus and a method of hierarchically designing an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
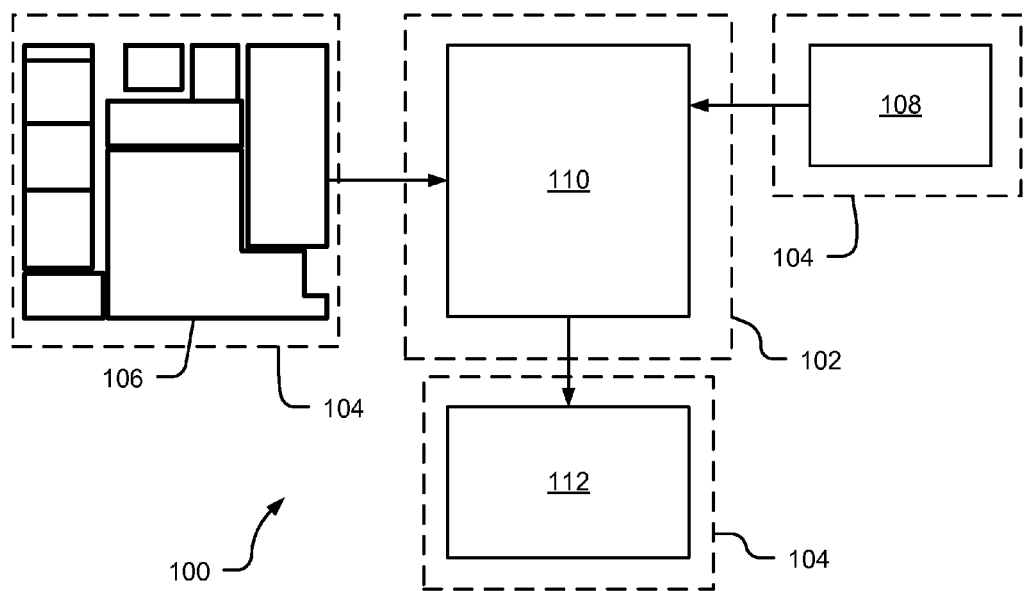
FIG. 1 is a schematic diagram of an integrated circuit hierarchical design tool apparatus.

According to a first example, there is provided an integrated circuit hierarchical design tool apparatus. The apparatus may comprise: a processor arranged to support a block coupling reconfiguration unit capable of receiving block layout data comprising block placement, terminal location data and intra-block connectivity data; wherein the block coupling reconfiguration unit is arranged to identify from the block layout data a block placement level block having a terminal respectively coupled to a plurality of other block placement level blocks by a plurality of nets, and to provide the block with an additional terminal capable of providing the same function as the terminal; and the block coupling reconfiguration unit is arranged to replace a net of the plurality of nets that is coupled to the terminal with a replacement net coupled to the additional terminal.

In relation to the coupling of blocks, this may refer to physical couplings between blocks, optionally via a sampling unit, and does not refer to coupling of electrical signals, for example as a result of parasitic effects.

The block coupling reconfiguration unit may be arranged to determine whether the net of the plurality of nets is suboptimal, and to replace the suboptimal net in response to the net being determined as suboptimal.

Determination of the net as being suboptimal may comprise determining whether the net exceeds a predetermined length.

The predetermined length may correspond to a maximum signal travel distance at a predetermined clock frequency.

The block layout data may relates to a processing system capable of using a plurality of clock signals; the predetermined clock frequency may be the fastest of the plurality of clock signals.

The block coupling reconfiguration unit may be arranged to provide the net with an in-line sampling unit.

The block coupling reconfiguration unit may be arranged to calculate a location of the additional terminal with respect to the block.

The block coupling reconfiguration unit may be arranged to calculate the location of the additional terminal so as to reduce the length of the replacement net.

The block coupling reconfiguration unit may be arranged also to calculate the location of the additional terminal so as to reduce the length of a further net and then to define the further net as being coupled to the additional terminal.

The replacement net may be shorter than the net.

The block coupling reconfiguration unit may be arranged to identify whether the calculated location of the additional terminal results in net congestion and to adjust the location of the additional terminal in response to the identification of the net congestion.

The block coupling reconfiguration unit may be arranged to identify whether the calculated location of the additional terminal results in terminal conflict and to adjust the location of the additional terminal in response to the identification of the net congestion.

The net may be coupled to another terminal of another block of the plurality of other blocks and the replacement net may be coupled to the another terminal in place of the net.

The block coupling reconfiguration unit may be arranged to analyse the block layout data to find a first block terminal location in respect of a first block identified as coupled to a second block terminal in respect of a second block and a third block terminal in respect of a third block identified as coupled to the second block terminal; and the block coupling reconfiguration unit may be arranged to identity a suboptimal coupling between the second block terminal and the third block terminal and to define an additional second block terminal in respect of the second block and to replace the coupling between the third block terminal and the second block terminal with a replacement coupling between the third block terminal and the additional second block terminal.

The processor may be arranged to generate data compatible with a block level design unit for hierarchical integrated circuit design.

According to a second example, there is provided a method of hierarchically designing an integrated circuit at a block placement level. The method may comprise: a block coupling reconfiguration unit receiving block layout data comprising block placement, terminal location data and intra-block connectivity data; the block coupling reconfiguration unit identifying from the block layout data a block placement level block having a terminal respectively coupled to a plurality of other block placement level blocks by a plurality of nets; the block coupling reconfiguration unit providing the block with an additional terminal capable of providing the same function as the terminal; and the block coupling reconfiguration unit replacing a net of the plurality of nets that is coupled to the terminal with a replacement net coupled to the additional terminal.

Because the illustrated examples may for the most part, be implemented using electronic components and circuits known to those skilled in the art, details will not be explained in any greater extent than that considered necessary, for the understanding and appreciation of the underlying concepts of the examples set forth herein and in order not to obfuscate or distract from the teachings herein.

Referring now to FIG. 1, an integrated circuit hierarchical design tool apparatus 100 comprises a Personal Computer (PC) or other computing apparatus having a processor 102 and a storage device, for example a memory of the PC, such as a digital memory 104, for storing block layout data 106. In this example, the block layout data 106 comprises electrical schematic data defining, for example, top level blocks according to a hierarchical design methodology for the design of a processing system, for example data concerning placement of blocks, locations of terminals or pins, such as driving pins, to be disposed on a semiconductor die to form an integrated circuit. The block layout data 106 may also comprise data intra-block connectivity data. The memory 104 may be operably coupled to the processor 102.

The processor 102 supports a semiconductor design tool, such as the Encounter® Digital Implementation (EDI) System available from Cadence®, the EDI system being suitably adapted to implement a top-level part of a hierarchical design flow.

In this respect, and in this example, a batch file of data 108 stored, in this example, in the digital memory 104 may comprise configuration data to be implemented by the semiconductor design tool in order to cause the semiconductor design tool to support a block coupling reconfiguration unit 110. This operation is in relation to the block placement level of the hierarchical design methodology as opposed to the block design level. However, the skilled person should appreciate that whilst the EDI system is being employed in this example other semiconductor design tools can be employed to provide the block coupling reconfiguration unit 110. The semiconductor design tool may be capable of accessing the integrated circuit design data 106 and receiving it.

The block coupling reconfiguration unit 110 may also be capable of generating an output data file 112 that is stored, in this example, in the digital memory 104 for later use by a block level design tool (not shown, but can be implemented using the EDI system described above) that is used as part of the hierarchical design methodology.

Figure 2:
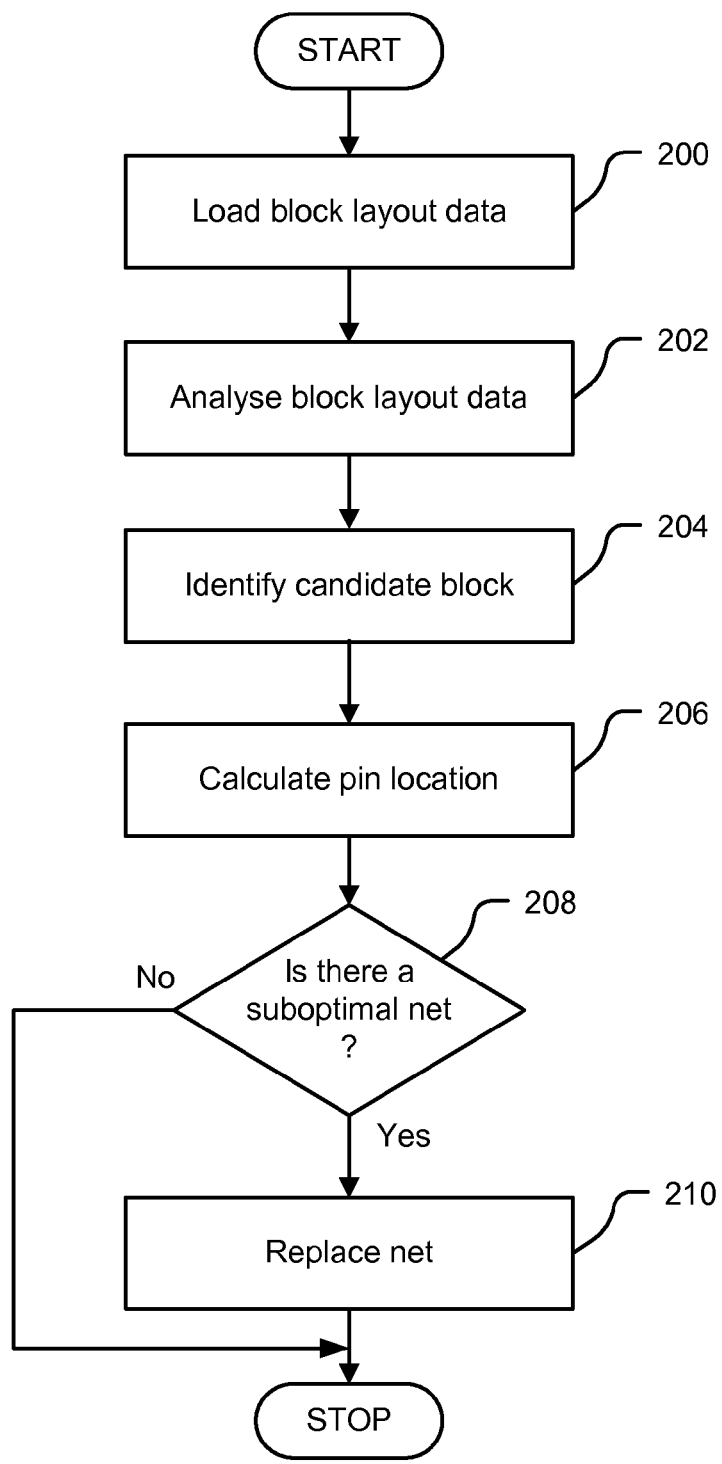
FIG. 2 is a flow diagram of a method of hierarchically designing an integrated circuit used by the apparatus of FIG. 1.

In operation (FIG. 2), the block layout data 106 needs to be generated and this is achieved using a so-called front end VLSI design tool. This tool is used by an engineer to place top-level blocks and terminals (as part of the block placement level of the hierarchical design methodology, which is the top-level of the hierarchical design methodology), sometimes referred to as "pins", for each block placed. Under the control of an engineer, the front end VLSI tool then generates a Register Transfer Level (RTL) netlist file constituting the block layout data 106 that can be used by the block coupling reconfiguration unit 110 in the following manner.

At start-up, the semiconductor design tool loads the batch file of data 108 and executes the batch file 108, thereby configuring the semiconductor design tool to provide the block coupling reconfiguration unit 110. The block coupling reconfiguration unit 110 then loads 200 the block layout data 106 for processing.

Figure 3:
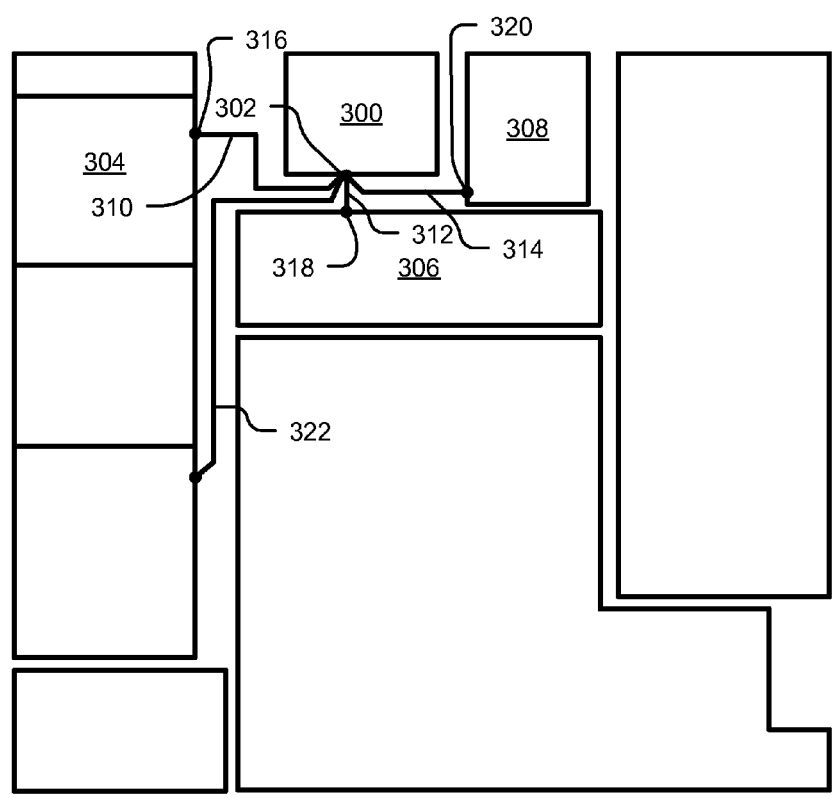
FIG. 3 is a schematic diagram of placements of blocks and terminals to be processed using the method of FIG. 2.
Figure 4:
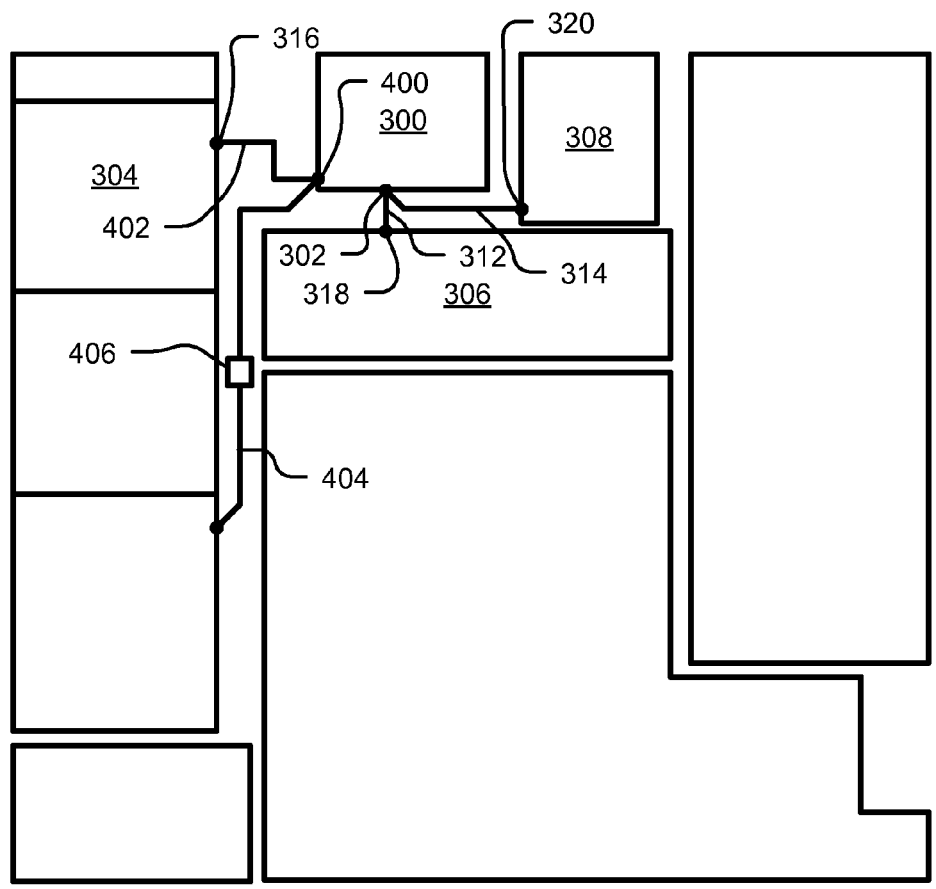
FIG. 4 is a schematic diagram of placements of blocks and terminals following processing by the method of FIG. 2.

Once loaded, the block layout data 106 may be analysed 202 by the block coupling reconfiguration unit 110 in order to identify 204 from the block layout data 106 a block 300 (FIG. 3) having a terminal 302 respectively coupled to a plurality of other terminals, for example a first terminal 316, a second terminal 318 and a third terminal 320 of a plurality of other blocks 304, 306, 308 by a plurality of nets 310, 312, 314. Once a candidate block with candidate nets has been identified 204, the block coupling reconfiguration unit 110 may define and provide 206 the block 300 with an additional terminal 400 (FIG. 4), the choice of location of which will be described in further detail later herein. The additional terminal 400 is, in this example, capable of providing or serving the same function as the terminal 302.

Thereafter, the block coupling reconfiguration unit 110 may then replace 210 a net 310 of the plurality of nets 310, 312, 314 coupled to the terminal 302 with a replacement net 402 coupling the additional terminal 400 to the terminal 302 if a criterion is met 208. In this example, the criterion for deciding whether a given net should be replaced is whether or not the given net is suboptimal.

In this respect, the block coupling reconfiguration unit 110 may determine whether the net 310 is suboptimal and then replace the suboptimal net in response to this determination. In this example, the determination as to whether a net is suboptimal is based upon the length of the net exceeding a predetermined length. This length may be determined by calculating a maximum signal travel distance capable at a predetermined clock frequency, the clock frequency being selected from amongst a plurality of clock signals used by the processing system being designed. The fastest clock signal may be selected.

In relation to the calculation of the location of the additional terminal 400, the block coupling reconfiguration unit 110 may be arranged to calculate a location of the additional terminal 400 with respect to the block 300 so as to reduce or even minimise the length of the replacement net 402. In this regard, the replacement net 402 is shorter than the net 310. In this example, the block coupling reconfiguration unit 110 may calculate a number of candidate additional terminal locations and then may select one of the number of candidate additional terminal locations, for example a most central location of the number of candidate additional terminal locations, to serve as the location for the additional terminal 400 where the distance between the number of candidate additional terminal locations is smaller than a predetermined distance, which can be technology and/or congestion goal specific.

In another example, where more than one net is suboptimal and the additional terminal 400 can serve as a coupling point for more than one suboptimal net, the reconfiguration of the other suboptimal nets is taken into account by the block coupling reconfiguration unit 110 when calculating the location of the additional terminal 400. Consequently, where a further suboptimal net 322 (FIG. 3) is identified that is a candidate for coupling to the additional terminal 400, the block coupling reconfiguration unit 110 may calculate the location of the additional terminal 400 so as to reduce or even minimise the length of the further net 322. In such an example, the length of the replacement net 402 may be improved or even optimised, but not to a maximum achievable, in order to accommodate replacement of the further suboptimal net 322 with a more efficient net 404 (FIG. 4) than the further suboptimal net.

As an additional optional feature, the block coupling reconfiguration unit 110 may identify whether the calculated location of the additional terminal 400 results in net congestion. Where net congestion is determined to result from placement of the additional terminal 400 in the location calculated by the block coupling reconfiguration unit 110, the block coupling reconfiguration unit 110 may attempt to adjust the location of the additional terminal 400 in response to the identification of the net congestion in order to remove such congestion. Similarly, the block coupling reconfiguration unit 110 may identify whether the calculated location of the additional terminal 400 results in terminal conflict, where the strips that form two contacts overlap and thereby cause a short-circuit. Where terminal conflict is determined to result from placement of the additional terminal 400 in the location calculated by the block coupling reconfiguration unit 110, the block coupling reconfiguration unit 110 may attempt to adjust the location of the additional terminal 400 in response to the identification of the terminal conflict in order to remove such a conflict.

In another example, it is not always possible to completely optimise a given net, for example the further net 322, such as in respect of the length of a further replacement net 404. In such circumstances, where the block coupling reconfiguration unit 110 determines that sufficient reconfiguration is not possible, the block coupling reconfiguration unit 110 provides the further replacement net 404 with an in-line sampling unit, or register 406.

Similarly, where appropriate, the block coupling reconfiguration unit 110 can provide another net (not shown) of the plurality of nets, which does not necessarily require reconfiguration through coupling to another terminal associated with the block 300 and is coupled to the terminal 302, with another in-line sampling unit (not shown).

Once processing of the block layout data 106 has been completed, the block coupling reconfiguration unit 110 may generate the output data file 112, for example an RTL Verilog file, compatible with a block level design unit (not shown), sometimes referred to as a back-end tool, for hierarchical integrated circuit design. Another example file type that can be used to provide a physical description of the changes calculated above is a Layout Extraction Format (LEF) file type. The block level design unit can be part of the integrated circuit hierarchical design tool apparatus 100.

It is thus possible to provide an integrated circuit hierarchical design tool apparatus and a method of hierarchically designing an integrated circuit that reduces top level route congestion in a design of the integrated circuit as well as reducing design cycle time. The apparatus and method also improves quality of results of the integrated circuit designed, for example improved power consumption, signal integrity, such as noise reduction, die space usage and frequency performance as a result of a reduction in length of a net.

Of course, the above advantages are examples, and these or other advantages may be achieved by the examples set forth herein. Further, the skilled person will appreciate that not all advantages stated above are necessarily achieved by embodiments described herein.

In the foregoing specification, the invention has been described with reference to specific examples of embodiments of the invention. It will, however, be evident that various modifications and changes may be made therein without departing from the broader scope of the invention as set forth in the appended claims.

The embodiments may be implemented in a computer program for running on a computer system, at least including code portions for performing steps of a method according to the invention when run on a programmable apparatus, such as a computer system or enabling a programmable apparatus to perform functions of a device or system according to the embodiment.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system, for example a batch file.

The computer program may be non-transitory and, for example, may be stored internally on computer readable storage medium or transmitted to the computer system via a computer readable transmission medium. All or some of the computer program may be provided tangibly, for example on computer readable media permanently, removably or remotely coupled to an information processing system. The tangible computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes, for example a non-transitory executing (running) program or portion of a program, current program values and state information, and the resources used by the operating system to manage the execution of the process. An operating system (OS) is the software that tangibly manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces a tangible resultant output information via I/O devices.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, blocks set forth in FIGS. 3 and 4 can be combined depending upon design convenience and the topology set forth in these figures is not intended to be limiting in any way.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

The examples set forth herein, or portions thereof, may be implemented as soft or code representations of physical circuitry or of logical representations convertible into physical circuitry, such as in a hardware description language of any appropriate type.

Also, the embodiments set forth herein are not limited to physical devices or units implemented in non-programmable hardware but can also be applied in programmable devices or units able to perform the desired device functions by operating in accordance with suitable program non-transitory code, such as mainframes, minicomputers, servers, workstations, personal computers, notepads, personal digital assistants, commonly denoted as 'computer systems'.

Other modifications, variations and alternatives to the examples set forth herein are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit hierarchical design tool apparatus, the apparatus comprising:
   a block coupling reconfiguration circuit configured to receive block layout data comprising block placement, terminal location data, and intra-block connectivity data for the integrated circuit, identify from the block layout data a block placement level block having a terminal respectively coupled to a plurality of other block placement level blocks by a plurality of nets, provide the block with an additional terminal capable of providing the same function as the terminal, calculate a location of the additional terminal with respect to the block, identify whether the calculated location of the additional terminal results in net congestion, adjust the location of the additional terminal in response to the identification of the net congestion, and replace a net of the plurality of nets that is coupled to the terminal with a replacement net coupled to the additional terminal, wherein an integrated circuit fabricated with the replacement net has reduced net congestion.

2. The apparatus as claimed in claim 1, wherein the block coupling reconfiguration circuit is configured to determine whether the net of the plurality of nets is suboptimal, and replace the suboptimal net in response to the net being determined as suboptimal.

3. The apparatus as claimed in claim 2, wherein determination of the net as being suboptimal comprises determining whether the net exceeds a predetermined length.

4. The apparatus as claimed in claim 3, wherein the predetermined length corresponds to a maximum signal travel distance at a predetermined clock frequency.

5. The apparatus as claimed in claim 4, wherein the block layout data relates to a processing system capable of using a plurality of clock signals, the predetermined clock frequency being the fastest of the plurality of clock signals.

6. The apparatus as claimed in claim 1, wherein the block coupling reconfiguration circuit is configured to provide the net with an in-line sampling unit.

7. The apparatus as claimed in claim 1, wherein the block coupling reconfiguration circuit is configured to calculate the location of the additional terminal so as to reduce a length of the replacement net.

8. The apparatus as claimed in claim 7, wherein the block coupling reconfiguration circuit is configured also to calculate the location of the additional terminal so as to reduce a length of a further net and then to define the further net as being coupled to the additional terminal.

9. The apparatus as claimed in claim 1, wherein the replacement net is shorter than the net.

10. The apparatus as claimed in claim 1, wherein the block coupling reconfiguration circuit is configured to identify whether the calculated location of the additional terminal results in terminal conflict.

11. The apparatus as claimed in claim 1, wherein the net is coupled to another terminal of another block of the plurality of other blocks and the replacement net is coupled to the another terminal in place of the net.

12. The apparatus as claimed in claim 1, wherein the block coupling reconfiguration circuit is configured to analyze the block layout data to find a first block terminal location in respect of a first block identified as coupled to a second block terminal in respect of a second block and a third block terminal in respect of a third block identified as coupled to the second block terminal, identify a suboptimal coupling between the second block terminal and the third block terminal, define an additional second block terminal in respect of the second block, and replace the coupling between the third block terminal and the second block terminal with a replacement coupling between the third block terminal and the additional second block terminal.

13. The apparatus as claimed in claim 1, wherein the processor is configured to generate data compatible with a block level design unit for hierarchical integrated circuit design.

14. A method of hierarchically fabricating an integrated circuit at a block placement level, the method comprising:
a block coupling reconfiguration unit receiving block layout data comprising block placement, terminal location data and intra-block connectivity data;
the block coupling reconfiguration unit identifying from the block layout data a block placement level block having a terminal respectively coupled to a plurality of other block placement level blocks by a plurality of nets;
the block coupling reconfiguration unit providing the block with an additional terminal capable of providing the same function as the terminal;
the block coupling reconfiguration unit calculating a location of the additional terminal with respect to the block;
the block coupling reconfiguration unit identifying whether the calculated location of the additional terminal results in net congestion;
the block coupling reconfiguration unit adjusting the location of the additional terminal in response to the identification of the net congestion;
the block coupling reconfiguration unit replacing a net of the plurality of nets that is coupled to the terminal with a replacement net coupled to the additional terminal; and
fabricating the integrated circuit, wherein the integrated circuit fabricated with the replacement net has reduced net congestion.

15. An integrated circuit fabricated by a hierarchical design layout tool, comprising:
a set of integrated circuit elements whose position in the integrated circuit is defined by a block coupling reconfiguration unit configured to receive block layout data comprising block placement, terminal location data, and intra-block connectivity data for the integrated circuit, identify from the block layout data a block placement level block having a terminal respectively coupled to a plurality of other block placement level blocks by a plurality of nets, provide the block with an additional terminal capable of providing the same function as the terminal, calculate a location of the additional terminal with respect to the block, identify whether the calculated location of the additional terminal results in net congestion, adjust the location of the additional terminal in response to the identification of the net congestion, and replace a net of the plurality of nets that is coupled to the terminal with a replacement net coupled to the additional terminal, wherein the integrated circuit fabricated with the replacement net has reduced net congestion.

* * * * *